(12) United States Patent
Chiu et al.

(10) Patent No.: US 10,490,529 B2
(45) Date of Patent: Nov. 26, 2019

(54) ANGLED DIE SEMICONDUCTOR DEVICE

(71) Applicant: SANDISK INFORMATION TECHNOLOGY (SHANGHAI) CO., LTD., Shanghai (CN)

(72) Inventors: Chin-Tien Chiu, Taichung (TW); Hem Takiar, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/623,598

(22) Filed: Jun. 15, 2017

(65) Prior Publication Data

US 2018/0342483 A1    Nov. 29, 2018

(30) Foreign Application Priority Data

May 27, 2017    (CN) .......................... 2017 1 0391000

(51) Int. Cl.
*H01L 21/56*    (2006.01)
*H01L 25/065*    (2006.01)
(Continued)

(52) U.S. Cl.
CPC ........ *H01L 25/0657* (2013.01); *H01L 21/568* (2013.01); *H01L 23/3107* (2013.01);
(Continued)

(58) Field of Classification Search
CPC ....... H01L 2224/06135; H01L 23/3107; H01L 25/0657; H01L 2225/06527
See application file for complete search history.

(56) References Cited

U.S. PATENT DOCUMENTS

2002/0127775 A1    9/2002  Haba et al.
2008/0006921 A1*   1/2008  Park .................... H01L 23/3128
                                                                257/686
(Continued)

FOREIGN PATENT DOCUMENTS

CN       104485291       4/2015
EP        0531724        3/1993
(Continued)

OTHER PUBLICATIONS

English language Abstract for KR101488617 published Jan. 30, 2015.
(Continued)

*Primary Examiner* — Ahmed N Sefer
(74) *Attorney, Agent, or Firm* — Vierra Magen Marcus LLP (57) ABSTRACT

A semiconductor device is disclosed mounted at an angle on a signal carrier medium such as a printed circuit board. The semiconductor device includes a stack of semiconductor die stacked in a stepped offset configuration. The die stack may then be encapsulated in a block of molding compound. The molding compound may then be singulated with slanted cuts along two opposed edges. The slanted edge may then be drilled to expose the electrical contacts on each of the semiconductor die. The slanted edge may then be positioned against a printed circuit board having solder or other conductive bumps so that the conductive bumps engage the semiconductor die electrical contacts in the drilled holes. The device may then be heated to reflow and connect the electrical contacts to the conductive bumps.

22 Claims, 8 Drawing Sheets

(51) Int. Cl.
 *H01L 23/31* (2006.01)
 *H01L 25/00* (2006.01)
 *H01L 23/00* (2006.01)
(52) U.S. Cl.
 CPC .............. *H01L 25/50* (2013.01); *H01L 24/16* (2013.01); *H01L 24/81* (2013.01); *H01L 2224/81815* (2013.01); *H01L 2224/92125* (2013.01); *H01L 2225/06517* (2013.01); *H01L 2225/06527* (2013.01); *H01L 2225/06562* (2013.01); *H01L 2225/06565* (2013.01)

(56) References Cited

U.S. PATENT DOCUMENTS

| | | |
|---|---|---|
| 2012/0051695 A1 | 3/2012 | Harada et al. |
| 2012/0056327 A1 | 3/2012 | Harada et al. |
| 2013/0009304 A1 | 1/2013 | Ko |
| 2013/0299977 A1 | 11/2013 | Dayringer et al. |
| 2014/0015116 A1* | 1/2014 | Fu .................. H01L 23/552 257/659 |
| 2015/0123288 A1 | 5/2015 | Lee |
| 2015/0303075 A1* | 10/2015 | Han .................. H01L 23/49805 438/113 |
| 2016/0013159 A1* | 1/2016 | Kwon .................. H01L 25/0657 257/627 |
| 2018/0040587 A1 | 2/2018 | Tao et al. |

FOREIGN PATENT DOCUMENTS

| | | | |
|---|---|---|---|
| JP | 2009193982 | | 8/2009 |
| KR | 1020050059791 | | 6/2005 |
| KR | 101488617 | B1 | 1/2015 |
| WO | WO 2013086741 | A1 * | 6/2013 |
| WO | WO 2014063281 | * | 5/2014 |

OTHER PUBLICATIONS

English language Abstract for CN104485291 published Apr. 1, 2015.
English language Abstract for JP2009193982 published Aug. 27, 2009.
English language Abstract for KR1020050059791 published Jun. 21, 2005.

* cited by examiner

ANGLED DIE SEMICONDUCTOR DEVICE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor die on top of each other. In order to provide access to bond pads on the semiconductor die, the die are stacked, either completely overlapping each other with a spacer layer in between adjacent die, or with a stepped offset. In a stepped offset configuration, a die is stacked on top of another die so that the die bond pads of the lower die are left exposed. This allows wire bonds to be formed on the die bond pads of the semiconductor die at each level.

As semiconductor die become thinner, and in order to increase memory capacity in semiconductor packages, the number of die stacked within a semiconductor package continues to increase. However, this can make for long bonds wire from the upper die down to the substrate. Long wire bonds are easily damaged or electrically shorted to other wire bonds, and also have higher signal to noise ratio than shorter bond wires. Moreover, larger numbers of semiconductor die in a package can adversely affect yields.

DETAILED DESCRIPTION

The present technology will now be described with reference to the figures, which in embodiments, relate to a semiconductor device mounted at an angle on a medium such as a printed circuit board (PCB). The semiconductor device comprises a stack of semiconductor die stacked in a stepped offset configuration. The die stack may then be encapsulated in a block of molding compound. The molding compound may then be singulated with slanted cuts along two opposed edges. One of the slanted edges may then be drilled to expose the electrical contacts on each of the semiconductor die. The drilled slanted edge may then be positioned against a printed circuit board having solder or other conductive bumps so that the conductive bumps engage the semiconductor die electrical contacts in the drilled holes. The device may then be heated to reflow and connect the electrical contacts to the conductive bumps.

The present technology provides several advantages. Directly affixing the semiconductor die conductive bumps to the PCB provides improved electrical connections and increased yield relative to wire bonded semiconductor devices. Additionally, providing the die stack in an angled connection on the PCB reduces a height of the die stack in comparison to embodiments where semiconductor die are stacked vertically on their edges.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal," and forms thereof, as may be used herein are by way of example and illustrative purposes only, and are not meant to limit the description of the present technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
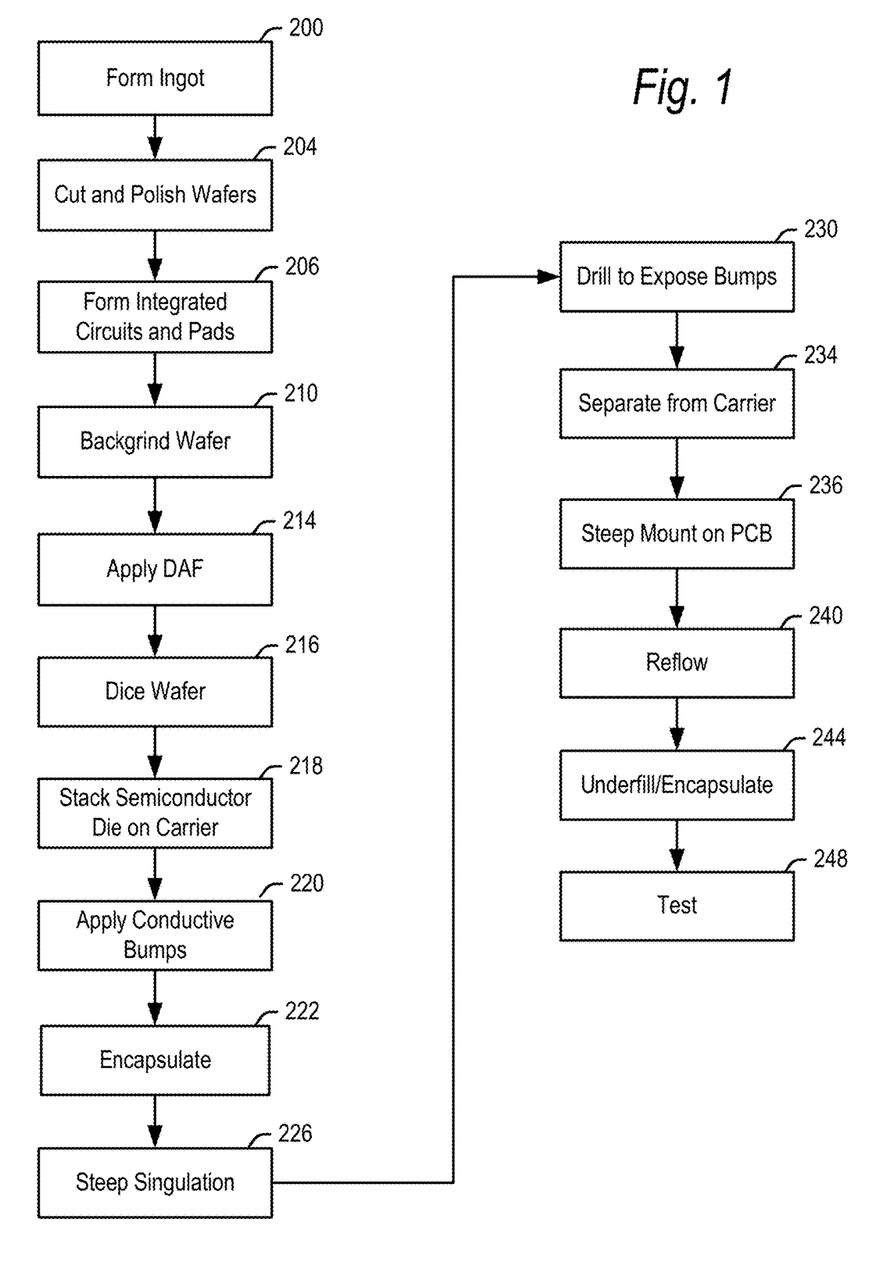
FIG. 1 is a flowchart for forming a semiconductor die according to embodiments of the present technology.
Figure 2:
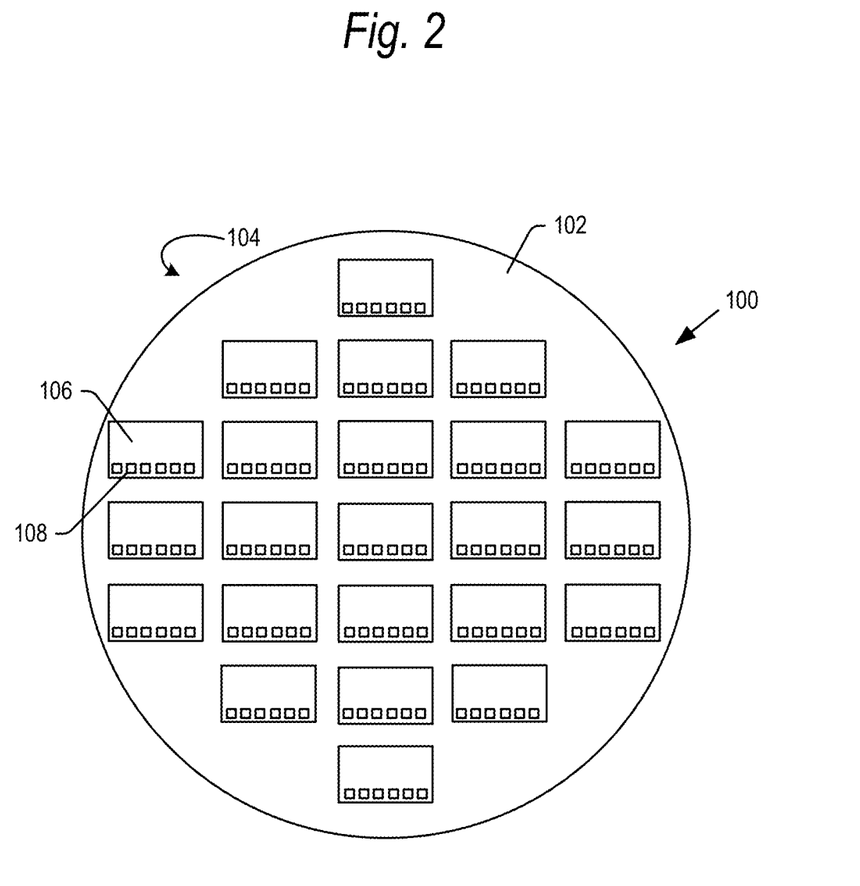
FIG. 2 is a front view of a semiconductor wafer showing a first major surface of the wafer.

An embodiment of the present technology will now be explained with reference to the flowchart of FIG. 1, and the views of FIGS. 2-14. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 opposite surface 102, to provide smooth surfaces. In step 206, the first major surface 102 may undergo various processing steps to divide the wafer 100 into respective semiconductor die 106, and to form integrated circuits of the respective semiconductor die 106 on and in the first major surface 102. These various processing steps may include metallization steps depositing metal contacts for transferring signals to and from the integrated circuits. The electrical contacts may include die bond pads 108 (one of which is numbered in each of FIGS. 2 and 3) exposed on the first major surface 102. The number of bond pads 108 shown is for simplicity and each die 106 may include many more die bond pads than are shown.

In embodiments, each die bond pad 108 may have a length and width of approximately 70 μm, though the length and width may vary in further embodiments, proportionately or disproportionately to each other. In embodiments, the die bond pads 108 may be formed of aluminum, or alloys thereof, but the pads 108 may be formed of other materials in further embodiments. In embodiments, the integrated circuits may operate as non-volatile NAND flash memory semiconductor die, though other types of integrated circuits are contemplated.

The die bond pads 108 may be spaced inward from an edge 110, for example a distance of 15 μm. In further embodiments, the die bond pads 108 may extend completely to the edge 110. The die bond pads 108 may be formed at the edge by dicing the semiconductor die 106 with a cut that goes through the die band pads 108, leaving the ends of the die bond pads at the edge 110. In further embodiments, the die bond pads 108 may be extended to the edge 110 using a redistribution layer forming electrical traces extending from the die bond pads 108 to the edge 110.

In step 210, the wafer may undergo a backgrind process against the second major surface 104 of the wafer 100 to thin the wafer from, for example, about 775 microns (μm) to a range of about 25 μm to 100 μm. It is understood that the wafer 100 may be thinner or thicker than this range after the backgrind step in further embodiments. In a step 214, a layer of die attach film (DAF) may be applied to the second major surface 104 of wafer 100. As one example, the DAF layer may be EM760L2-P from Nitto Denko, having headquarters in Japan.

The DAF layer may have a thickness of 3 μm to 30 μm, though it may be thinner or thicker than that in further embodiments. As explained below, a block of stacked semiconductor die (spaced apart from each other by the thickness of DAF layer) may be mounted at an angle on a PCB so that the die bond pads on each die align with solder balls provided on the PCB. The thickness of the DAF layer defines the spacing between the semiconductor die in the stack and the DAF thickness may be provided to ensure that the spacing between each die matches the spacing of each row of solder balls on the PCB.

The semiconductor die 106 may next be diced from the wafer 100 in step 216. In one embodiment, the wafer 100 may be diced using a stealth lasing process. The wafer 100 may be supported on a chuck or other support surface (not shown) with the integrated circuits on the first major surface 102 facing the support surface and the second major surface 104 facing way from the support surface. A laser may then emit a pulsed laser beam at a wavelength that transmits through the second major surface of the wafer 100, for example at infrared or near-infrared wavelengths. The pulsed laser beam may be focused to a point beneath the wafer's surface 104 using an optical system, for example including one or more collimating lenses. When the laser beam hits a peak power density at the focal point, the wafer absorbs the energy, and a pinpoint hole is created beneath the wafer's surface.

The laser may be moved along scribe lines of the wafer 100 and activated at a number of points so that a number of closely situated pinpoint holes are formed at an intermediate depth of the wafer (between the first and second major surfaces 102, 104 of the wafer). The rows and columns of pinpoint holes define the eventual shape of each semiconductor die 106 to be diced from wafer 100. The laser may form a single layer of pinpoint holes at a single depth, or multiple (two or more) layers of pinpoint holes at multiple depths. The pinpoint holes may generate cracks in the wafer which propagate toward the first and second major surfaces 102, 104 to complete the dicing of the wafer. The wafer 100 may be diced by techniques other than stealth lasing in further embodiments. Such additional dicing techniques include blade cutting and waterjet cutting.

Figure 3:
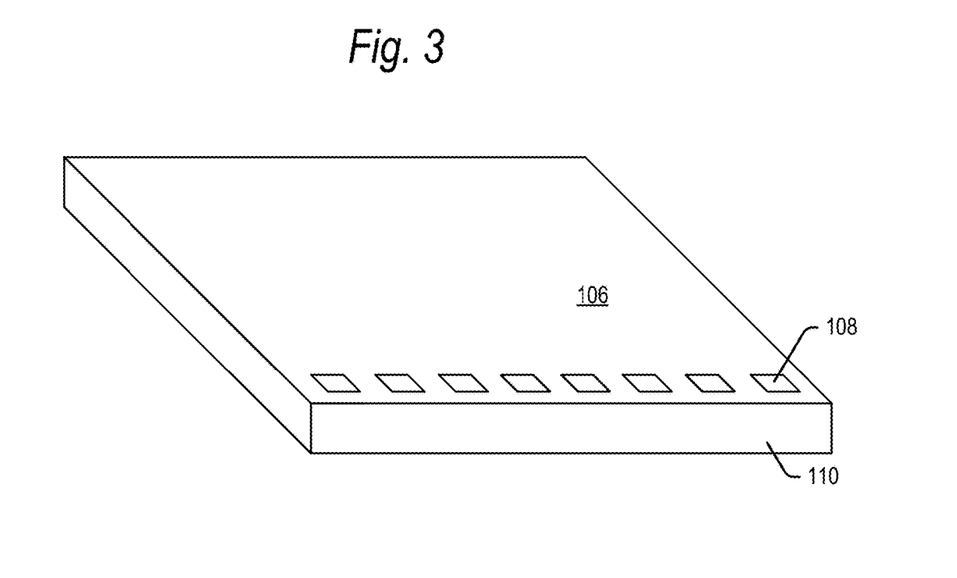
FIG. 3 is a perspective view of a single semiconductor die from the wafer.
Figure 4:
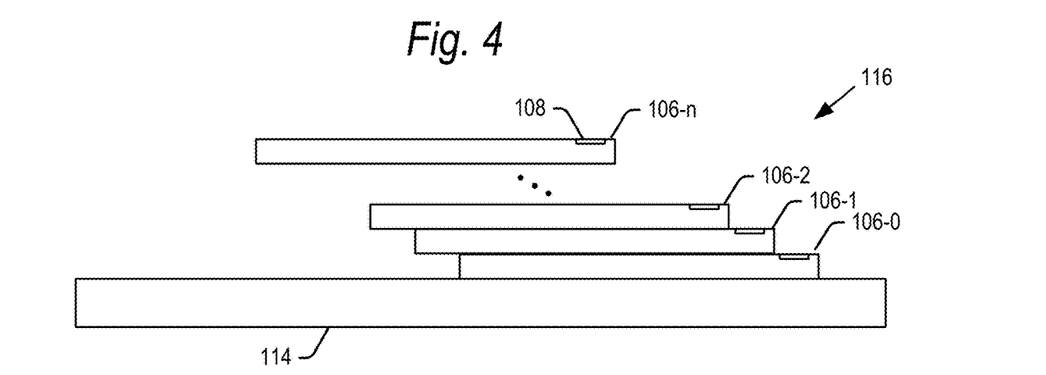
FIG. 4 is a side view of a group of semiconductor die stacked on a carrier.

A completed, diced semiconductor die 106 including die bond pads 108 adjacent edge 110 is shown in FIG. 3. Again, the number of die bond pads 108 is shown for ease of understanding, and die 106 may include many more die bond pads 108 than are shown. A plurality of wafers 100 may be fabricated according to steps 200-216 explained above. Thereafter, a pick and place robot may take semiconductor die 106 from the same wafer or different wafers and stack them in a stepped, offset configuration on a carrier 114 in step 218 as shown in FIG. 4. The edges 110 including die bond pads 108 may be aligned along a common side of the die stack 116. The carrier 114 may be formed of any of a variety of rigid, planar materials and, as explained below, does not form part of the finished semiconductor device.

FIG. 4 shows die 106-0, 106-1, . . . , 106-n in the die stack 116. The number of semiconductor die 106 in a die stack 116 may vary in embodiments, including for example 2, 4, 8, 16, 32, 64 or 128 semiconductor die. There may be more or other numbers of semiconductor die in a die stack 116 in further embodiments. The die 106 in the die stack 116 may be tacked to each other and the carrier 114 by the DAF layer on the surfaces 104 of the respective die 106.

Figure 5:
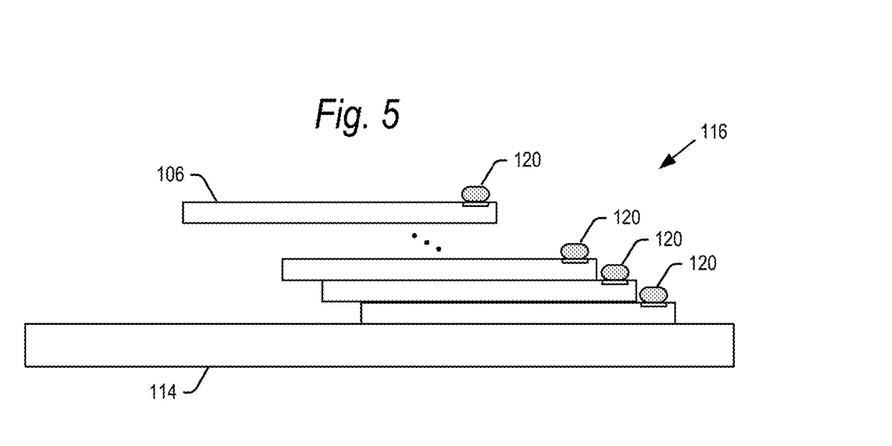
FIG. 5 is a side view of a group of semiconductor die stacked on a carrier and including conductive bumps formed on die bond pads of the semiconductor die.
Figure 6:
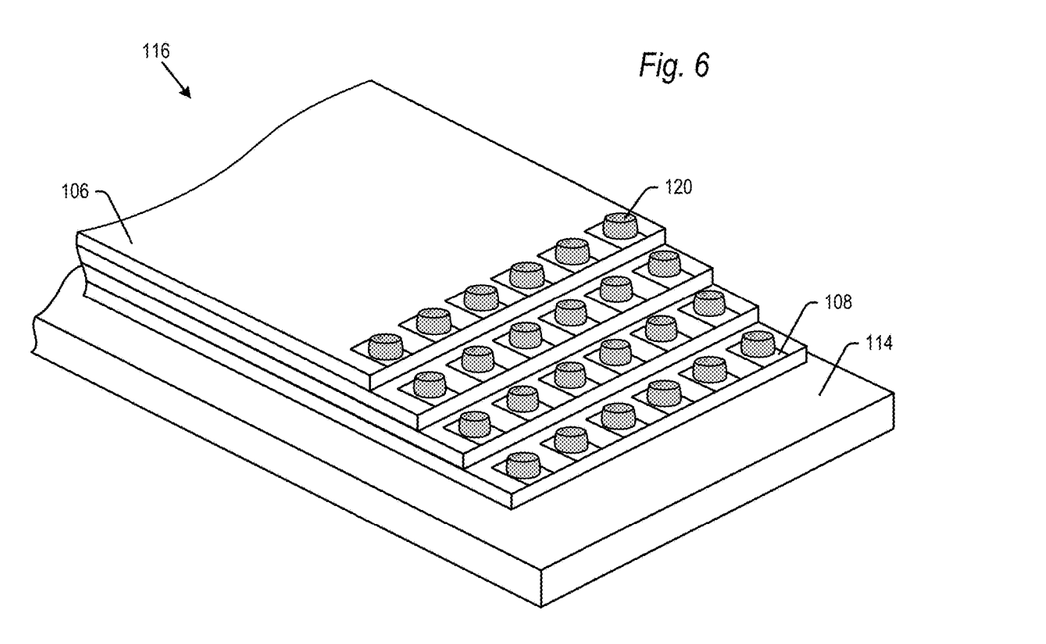
FIG. 6 is a perspective view of a group of semiconductor die stacked on a carrier and including conductive bumps formed on die bond pads of the semiconductor die.

In accordance with aspects of the present technology, conductive bumps 120 may be affixed to each of the die bond pads 108 of die 106 in step 220 as shown in FIGS. 5 and 6. The conductive bumps 120 may be formed on the die bond pads 108 by different technologies, but in one example, the conductive bumps may be formed for example by stud bumping, where the bumps are formed and deposited by a wire bond capillary (not shown) otherwise used to form wire bonds. In such embodiments, a first conductive bump may be deposited by forming a molten ball at the tip of a wire within the wire bond capillary by electronic flame off (EFO). The molten ball may then be pressed onto the contact pad 109 using an elevated temperature and ultrasonic oscillation and left behind to form a conductive bump 120. In one embodiment, the conductive bumps 120 may be formed under a pressure of 20 g at a temperature of 145° C. for about 12 ms using an ultrasonic frequency of 120 KHz. These parameters are by way of example only, and each may vary in further embodiments. Once a conductive bump 120 is affixed, the wire bond capillary may pull away to break the wire and leave the conductive bump 120 in place.

In embodiments, the conductive bumps 120 may have a diameter of approximately 30 to 70 µm, and more particularly about 50 µm, though the diameter of the conductive bump 120 may be greater or smaller than that in further embodiments. In one embodiment, the conductive bumps may have a height of between 20 µm and 35 µm, and more particularly about 25 µm, though the height of the conductive bumps 120 may be higher or lower than this in further embodiments.

The conductive bumps 120 may be formed of gold or a gold alloy, though they may be formed of another metal in further embodiments, such as for example copper or solder. In the above embodiment, the conductive bump is formed on the die bond pads 108 after the die are diced from the wafer and stacked. In further embodiments, the conductive bumps 120 may be formed on the die bond pads in a stud bumping process during formation of the semiconductor die 106 when still part of a semiconductor wafer 100. In further embodiments, the conductive bumps 120 may be formed on individual semiconductor die (FIG. 3) before they are stacked into die stack 116.

Figure 7:
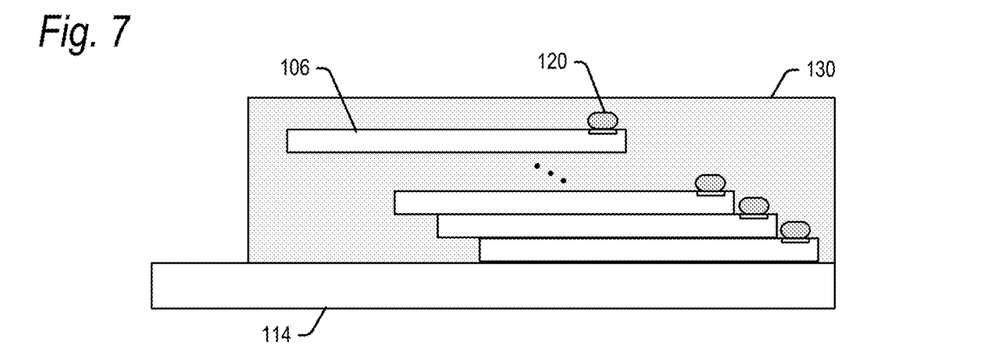
FIG. 7 is a side view of a semiconductor device encased in a protective coating such as mold compound.

Once the conductive bumps 120 are formed on die pads 108 in the die stack 116, the die stack 116 may be encapsulated in mold compound in step 222 as shown in FIG. 7. The die stack 116 may be placed within a mold chase (not shown) comprising upper and lower mold plates. Molten mold compound 130 may then be injected into the mold chase to encase the die stack 116 in a protective enclosure in for example a compression molding process. Mold compound 130 may include for example solid epoxy resin, Phenol resin, fused silica, crystalline silica, carbon black and/or metal hydroxide. Such mold compounds are available for example from Sumitomo Corp. and Kyocera Corp., both having headquarters in Japan. Other mold compounds from other manufacturers are contemplated. The mold compound may be applied according to other known processes, including by FFT (flow free thin) molding, transfer molding or injection molding techniques.

Figure 8:
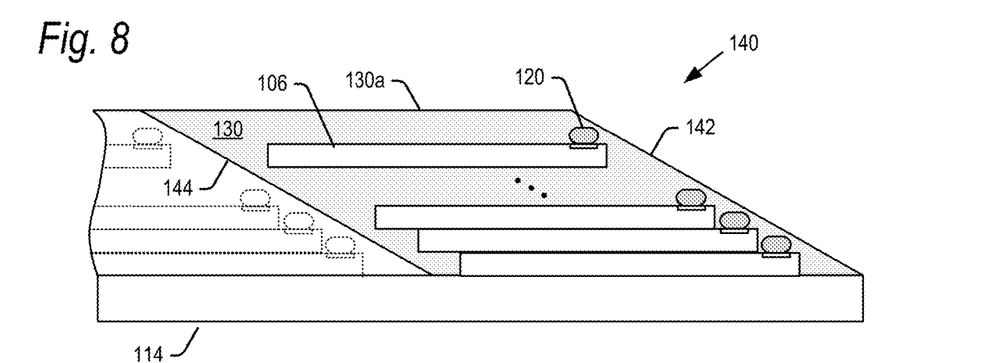
FIG. 8 is a side view of an encapsulated semiconductor device singulated with angled leading and trailing edges according to embodiments of the present technology.

In order to achieve economies of scale, several die stacks 116 may be encapsulated together on the carrier 114 simultaneously. In step 226, the respective encapsulated die stacks are singulated (cut) from each other to form individual encapsulated die stacks, referred to herein as semiconductor devices 140. In accordance with aspects of the present technology, one or more semiconductor devices 140 may be mounted at an angle onto a PCB as described below. In order to allow for the angled connection, respective semiconductor devices 140 are singulated from each other using an angled, or steep, cut. This feature is shown in FIG. 8.

The mold compound 130 has an upper surface 130a that is generally planar and parallel to the upper surface of the carrier 114. In accordance with aspects of the present technology, respective semiconductor devices 140 may be singulated by making an angled cut through the mold compound, which angle generally follows an angle of the stepped offset of the die 106 within the semiconductor devices 140. In embodiments, this angle may be between 30° and 60°, and more particularly about 45°. However, it is understood that the angle may be formed at some other non-perpendicular angle that is lesser than 30° and greater than 60° in further embodiments. Such an angle may range from greater than 0° and less than 90°.

A first angled cut defines an angled edge adjacent the conductive bumps 120, referred to herein as the leading edge 142 of the semiconductor device 140. A second angled cut, generally or exactly parallel to the first angled cut, defines an angled edge adjacent the end of the semiconductor die 106 not including the conductive bumps 120. This angled edge is referred to herein as the trailing edge 144 of the semiconductor device 140. The second cut defining the trailing edge 144 may also define the leading edge of a second semiconductor device 140 (shown in phantom in FIG. 8).

The cut may be made by a variety of cutting methods including for example sawing, water jet cutting, laser cutting, water guided laser cutting, dry media cutting, and diamond coating wire cutting. The two edges of the semiconductor device 140 which extend between the leading and trailing edges 142, 144 may be made perpendicularly to the upper surface 130a of the mold compound 130. Thus the semiconductor device 140 may have six surfaces, a top surface, a bottom surface and two edges, each of which are perpendicular to each other and together form a square or rectangle. The last two surfaces are the angled leading and trailing edges 142, 144.

Figure 9:
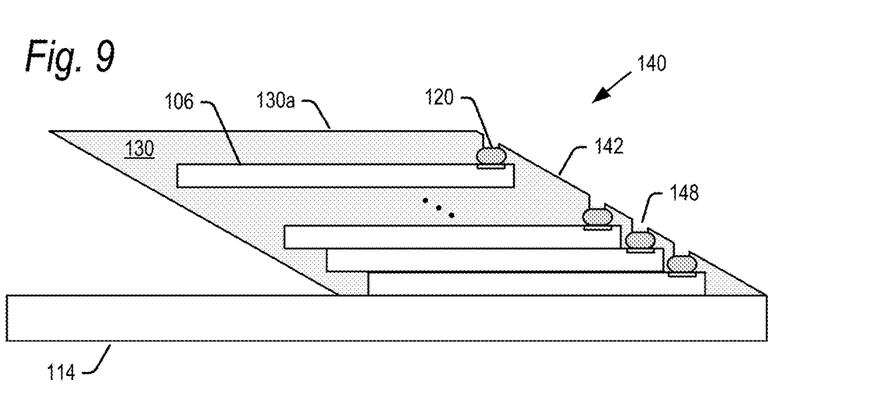
FIG. 9 is a side view of an encapsulated semiconductor device with holes drilled in the angled leading edge to expose the electrical contacts on the semiconductor die according to embodiments of the present technology.

In step 230, the semiconductor device 140 is drilled at the leading edge 144 to expose each of the conductive bumps through the mold compound 130 as shown in FIG. 9. The drilling forms holes 148 horizontally across the die bond pads of a single semiconductor die 106, and also vertically along the stack of semiconductor die. The holes may be formed with a drill, laser or other hole-forming method. In one such further embodiment, the holes may be etched in a photolithography process. In further embodiments, it is conceivable that the upper mold plate used during the encapsulation step 222 include fingers that align on top of the conductive bumps when the upper and lower mold plates are brought together, which fingers prevent mold compound from forming in the space occupied by the fingers. Thus, after the encapsulation step 222, the holes 148 are already formed. In such an embodiment, the holes 148 may optionally be air-blasted or otherwise cleaned to ensure that the conductive bumps are exposed at the base of the holes 148.

The diameter of the holes is large enough to allow solder bumps on the PCB (explained below) to come into direct contact with the conductive bumps 120. In one embodiment, each of the holes may be between 25 µm and 50 µm, but these dimensions are by way of example and may vary above or below that range in further embodiments. It is conceivable that the holes 148 be filled with a metal, initially in molten form and cured to a B-stage, so that the metal is flush with the surface of the leading edge 142. In one example, such a metal may be solder.

Figure 10:
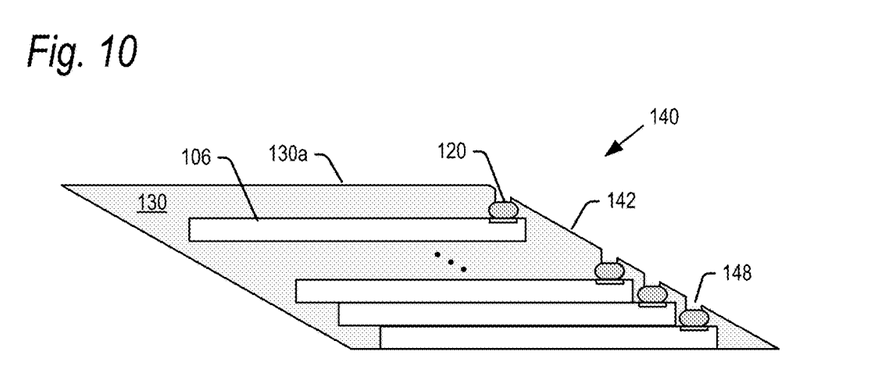
FIG. 10 is a side view of a completed semiconductor device according to embodiments of the present technology.
Figure 11:
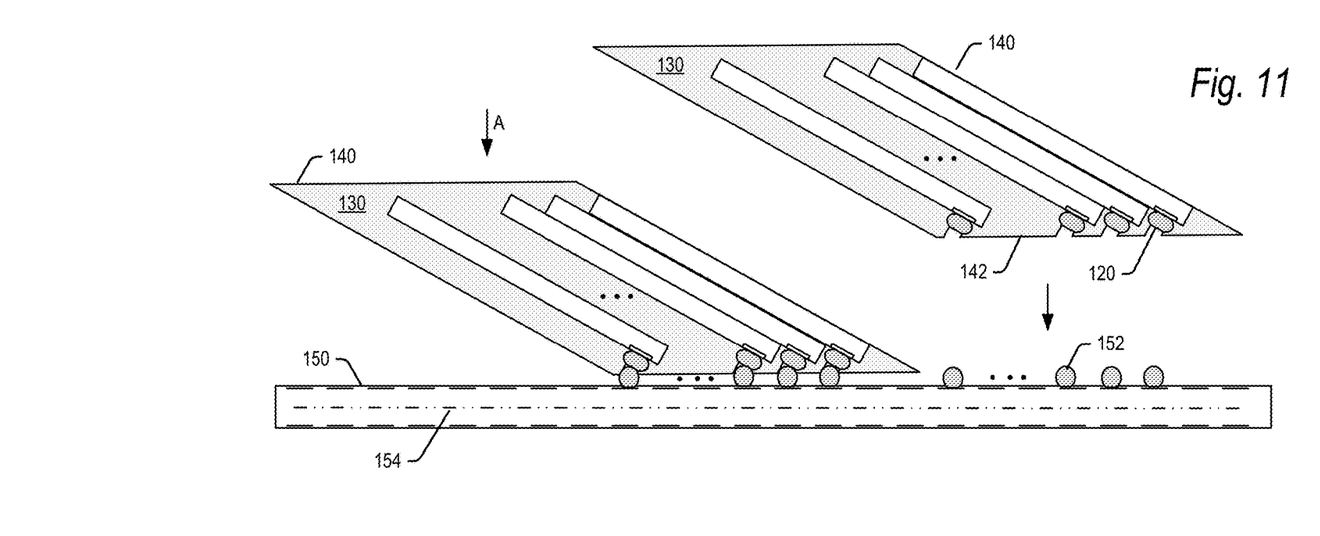
FIG. 11 is a side view of semiconductor devices according to embodiments of the present technology being mounted on a signal carrier medium.

In step 234 the respective semiconductor devices 140 are removed from the carrier 114 as shown in FIG. 10. In step 236, one or more of the semiconductor devices 140 may be steep mounted on a PCB 150. In particular, the semiconductor device may be rotated and positioned such that the leading edge 142 is parallel and adjacent to a PCB 150 as shown in FIG. 11. The PCB 150 may for example be a high density interconnect (HDI) PCB. Other signal carrier mediums such as other PCBs and various substrates are possible in further embodiments.

The PCB 150 may include a pattern of solder balls 152. The pattern of solder balls is arranged in a number of rows (into the page of FIG. 11). In embodiments, there are at least as many solder balls 152 as there are conductive bumps in the one or more semiconductor devices 140 to be mounted on the PCB 150. The solder balls 152 are also arranged in a pattern so as to mate within the holes 148 on the leading edge 142 of each semiconductor device 140 mounted on the PCB. These positions may be determined based on the known positions of the conductive bumps 120 and holes 148 on the leading edge(s) of the one or more semiconductor devices 140 to be mounted on the PCB 150.

The solder balls 152 may be applied to the PCB 150 in the desired pattern using a variety of technologies, including for example stud bumping. The PCB 150 may further include electrical conductors 154 for transferring signals and other voltages to/from the solder balls 152. While solder balls are shown in FIG. 11, it is understood that solder paste or other conductive contacts may be used instead of solder balls in further embodiments. The solder balls or other conductive contacts may extend above a surface of the PCB 150 sufficiently to fit within the holes 148 and lie in direct contact with the conductive bumps 120.

A semiconductor device 140 may be positioned on the PCB 150 so that the solder balls 152 lie in direct contact with the conductive bumps 120. Thereafter, the semiconductor device 140 and PCB 150 may be heated to reflow the conductive bumps 120 and solder balls 152 in step 240 to cure the conductive bumps and solder balls to a C-stage and form secure physical and electrical connections between the semiconductor device 140 and PCB 150. The process may be repeated to mount additional semiconductor devices on the PCB 150 as shown in FIG. 11. Alternatively, the reflow process may be performed after all semiconductor devices to be included are positioned on the PCB 150.

Surface adhesion and wicking will ensure a good contact between the solder balls 152 and conductive bumps 120 as the solder balls and conductive bumps melt, reflow with each other and then harden. However, in further embodiments, a support arm (not shown) may exert a light force against the semiconductor devices 140 in the direction of arrow A to support the devices 140 during reflow and to push the solder balls 152 against the conductive bumps 120.

Figure 12:
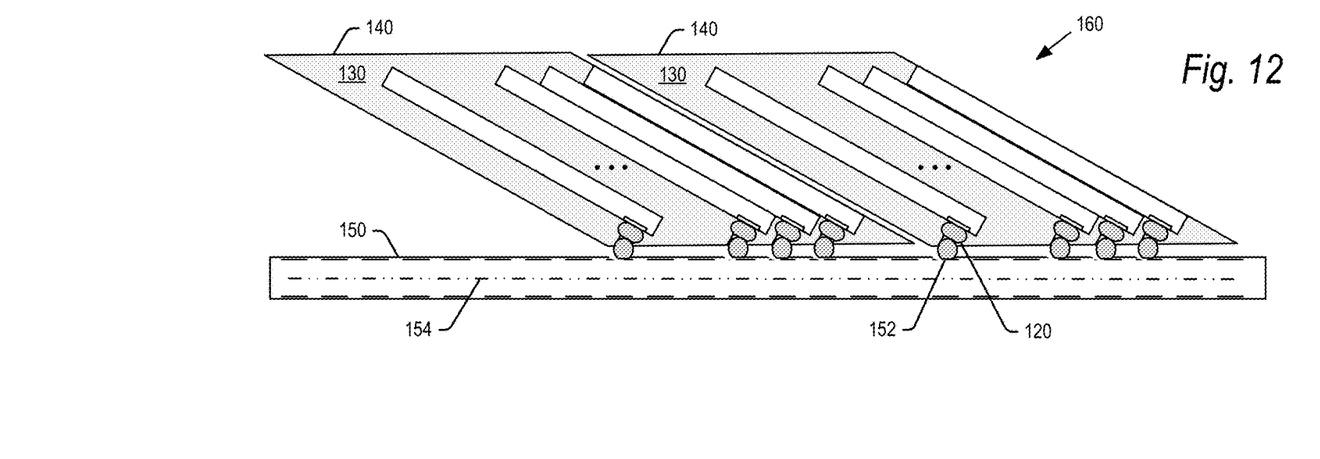
FIG. 12 is a side view of a completed semiconductor assembly according to embodiments of the present technology.
Figure 13:
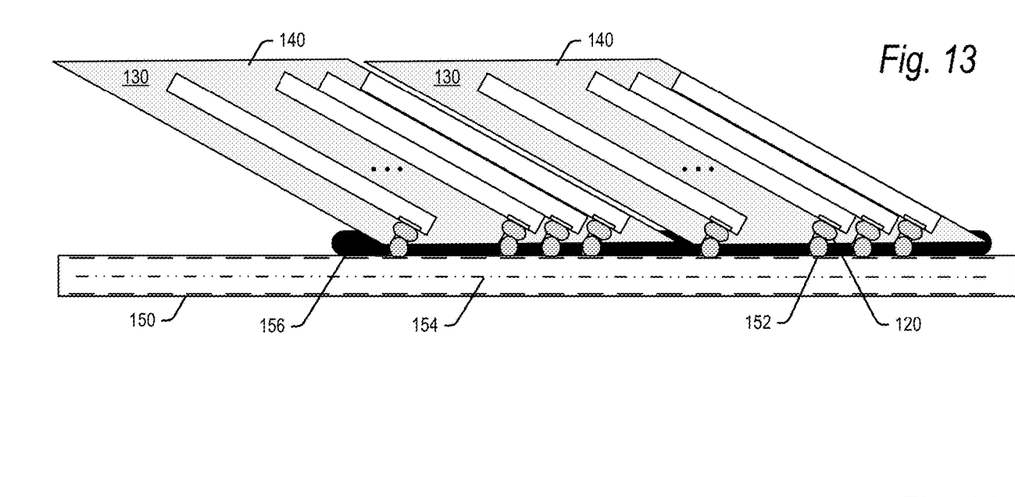
FIG. 13 is a side view of a completed semiconductor assembly according to embodiments of the present technology and further including an under-fill layer.

A finished semiconductor assembly 160 is shown in FIG. 12. The assembly 160 shown includes a pair of semiconductor devices 140 affixed to the PCB 150 via the conductive bumps 120 and solder balls 152. However, a finished semiconductor assembly 160 may include a single semiconductor assembly 160, or more than two semiconductor assemblies 160. In examples, a finished semiconductor assembly may include three, four, five, six, seven, eight or more semiconductor devices 140.

As noted, fabrication of the semiconductor assembly 160 shown in FIG. 12 may be completed after the reflow process of step 240. However, in further embodiments shown in FIG. 13, an epoxy or other resin, polymer or protective layer 156 may be applied to the joined conductive bumps/solder balls, in a space between the PCB 150 and semiconductor device(s) 140. The protective layer 156 may be injected into the spaces between the semiconductor device(s) 140 and PCB 150, in an under-fill step 244. The protective layer 156 may be applied as a liquid which then hardens into a solid layer. This under-fill step protects the electrical connections at each of the conductive bump/solder ball junctions, and further secures the semiconductor device 140 onto the PCB 150. Various polymers may be used as protective layer 156, but in embodiments, it may be Hysol epoxy resin from Henkel Corp., having offices in California, USA.

Figure 14:
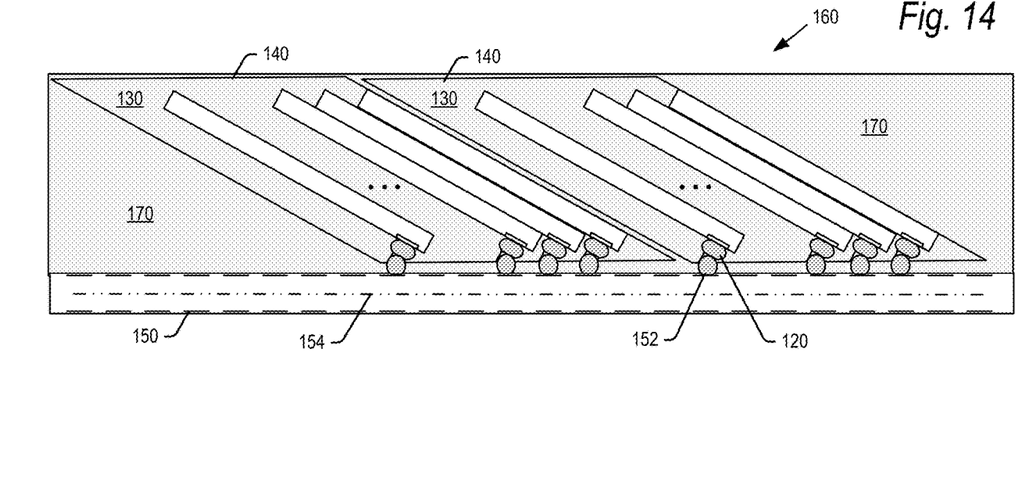
FIG. 14 is a side view of a completed semiconductor assembly according to embodiments of the present technology further including an exterior encapsulation.

Instead of protective layer 156, the semiconductor assembly 160 may undergo a further encapsulation process in step 240 to encase the entire semiconductor assembly 160 in mold compound 170. Such an embodiment is shown in FIG. 14. Such an encapsulation step may employ the same methods used in in the initial encapsulation step 222.

Although not shown, additional components may be mounted on the PCB 150. Such additional components may comprise for example an ASIC or other controller die, DRAM or other random access memory, or other components. The PCB 150 may further include passive components such as resistors, capacitors, inductors.

After fabrication of the semiconductor assembly 160, the semiconductor assembly 160 may undergo final stage testing in a step 248. One such test may be a drop test, where the assembly 160 is dropped from a height, and then tested for operation. Another such test may be a thermal cycling test where the assembly 160 is cycled between a high temp (e.g., 85° C. or 125° C.) to a low temp (−40° C.) for up to 1000 times, and then tested for operation. Other tests may be performed. The die 106 and/or semiconductor devices 140 may be tested at earlier stages in the fabrication process, before and/or after being assembled into the semiconductor assembly 160, and before and/or after reflow. If a semiconductor die is identified which is defective and non-functional, that die can be excluded from the operation of the semiconductor assembly 160 by system level programming of the semiconductor assembly 160.

In embodiments described above, the semiconductor devices 140 are encapsulated, and the holes 148 drilled, prior to being mounted on the PCB 150. In further embodiments, it is conceivable that the semiconductor devices 140 without the mold compound 130 (i.e., just the stacked semiconductor die 106 and conductive bumps 120) may be mounted on the PCB 150. Such an embodiment may be fabricated as described above, including the under-fill protective layer 156, or the mold compound 170 (in this embodiment, the only mold compound applied).

In embodiments described above, the semiconductor devices 140 include conductive bumps 120 on the die bond pads 108, which conductive bumps are exposed through holes 148 to allow direct contact with solder balls 152. In further embodiments, it is conceivable that the conductive bumps 120 be omitted. In such embodiments, the holes 148 in the mold compound 130 would be formed to expose the die bond pads 108 on the die 106. In such embodiments, the semiconductor devices 140 may be mounted on the PCB 150 as described above, but in this embodiments, the solder balls 152 extend from the PCB 150 into direct contact with the die bond pads 108. As used herein, electrical contacts on the semiconductor die may refer to the die bond pads 108 and/or the conductive bumps 120.

The angled-die semiconductor assembly 160 may comprise an electronic component that can be implemented in a host device. The angled-die semiconductor assembly 160 according to the present technology provides several advantages. For example, it attaches to an array of solder balls (152) on the PCB 150 in a manner analogous to a conventional horizontal flip chip. However, where conventional horizontal flip chips are able to affix a single die to the array of solder balls, the angled-die semiconductor assembly 160 is able to affix an entire block of angled semiconductor die.

Additionally, the angled-die semiconductor assembly 160 may be coupled directly to a PCB without using wire bonds. Wire bonds add additional costs and processing steps. Additionally, wire bonding to die in a die stack limits the number of die that can be provided in the stack, as performance issues such as noise, electrical shorting and parasitic RLC increase as the number of die in the stack increase. In the present technology, each die in the assembly 160 is affixed directly to the PCB, and die may be added to the block without increasing any of the above-mentioned performance issues.

Moreover, the angled-die semiconductor assembly 160 provides a large number of die in a minimal overall form factor. Angling the semiconductor die 106 in the assembly allows the multiple die to be directly connected to the PCB, while minimizing the critical height dimension. Additionally, the angle of the stepped semiconductor die 106, and the leading and trailing edges 142, 144, of the semiconductor device 140 may be varied depending on fabrication needs. Where for example height is less critical than length, the angle of the die and edges 142, 144 may be increased, resulting in higher but shorter semiconductor device(s) 140 in the assembly 160.

In summary, an example of the present technology relates to a semiconductor device, comprising: a plurality of semiconductor die mounted together in a stepped, offset stack, the plurality of semiconductor die each including a plurality of electrical contacts; and a mold compound encasing the plurality of semiconductor die, the mold compound having a first major surface, and a leading edge, the leading edge formed at a non-perpendicular angle to the major surface and the plurality of electrical contacts exposed at the leading edge.

In a further example, the present technology relates to a semiconductor device, comprising: a plurality of semiconductor die mounted together in a stepped, offset stack, the plurality of semiconductor die each including a plurality of die bond pads; a plurality of conductive bumps formed on the plurality of die bond pads; and a mold compound encasing the plurality of semiconductor die, the mold compound having a first major surface, and a leading edge, the leading edge formed at a non-perpendicular angle to the major surface and the plurality of conductive bumps exposed at the leading edge.

In another example, the present technology relates to a semiconductor assembly, comprising: a signal carrier medium; and a semiconductor device, comprising: a plurality of semiconductor die mounted together in a stepped, offset stack, the plurality of semiconductor die each including a plurality of electrical contacts, and a mold compound encasing the plurality of semiconductor die, the mold compound having a first major surface, and a leading edge, the leading edge formed at a non-perpendicular angle to the major surface and the plurality of electrical contacts exposed at the leading edge, wherein the leading edge of the semiconductor device is mounted adjacent to the signal carrier medium to mount the semiconductor device to the signal carrier medium at an angle, said angle defined by the angle formed by the leading edge to the first major surface of the mold compound.

In another example, the present technology relates to a method of forming a semiconductor device, comprising (a) forming electrical contacts on a plurality of semiconductor die; (b) stacking the plurality of semiconductor die in a stepped, offset configuration; (c) encapsulating the stack of semiconductor die in a protective coating; (d) cutting an edge of the protective coating at a non-perpendicular angle to other surfaces of the coating; and (e) exposing the plurality of electrical contacts at the non-perpendicular edge of the protective coating.

In another example, the present technology relates to a semiconductor device, comprising: a plurality of semiconductor die mounted together in a stepped, offset stack, the plurality of semiconductor die each including electrical contact means for transferring voltages to and from the plurality of semiconductor die; encasing means for encasing the plurality of semiconductor die, the encasing means comprising angling means enabling the semiconductor device to affixed to a signal carrier means at an angle; and means for enabling transfer of the voltages from the electrical contact means to the signal carrier means through the encasing means.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a plurality of semiconductor die mounted together in a stack in a first direction, and offset from each other along a second direction different than the first direction, the plurality of semiconductor die each including a plurality of electrical contacts; and
   a mold compound encasing the plurality of semiconductor die, the mold compound having a first major surface, and a leading edge, the leading edge formed at a non-perpendicular angle to the major surface defined by the offset of the semiconductor die in the second direction and the plurality of electrical contacts exposed at the leading edge.

2. The semiconductor device of claim 1, wherein the electrical contacts comprise die bond pads defined in or on surfaces of the plurality of semiconductor die.

3. The semiconductor device of claim 1, wherein the electrical contacts comprise conductive bumps formed on die bond pads defined in or on surfaces of the plurality of semiconductor die.

4. The semiconductor device of claim 1, wherein the mold compound includes holes formed in the mold compound, the holes exposing the electrical contacts.

5. The semiconductor device of claim 1, wherein the semiconductor device is configured to be mounted to a signal carrier medium at an angle greater than 0° and less than 90°, said angle defined by the angle formed by the leading edge to the first major surface of the mold compound.

6. The semiconductor device of claim 1, wherein the leading edge forms an angle of between 30° and 60° with the first major surface.

7. The semiconductor device of claim 1, wherein the leading edge forms an angle of 45° with the first major surface.

8. The semiconductor device of claim 1, wherein the semiconductor die comprise non-volatile memory die.

9. A semiconductor device, comprising:
a plurality of semiconductor die mounted together in a stepped, offset stack, the plurality of semiconductor die each including a plurality of die bond pads;
a plurality of conductive bumps formed on the plurality of die bond pads; and
a mold compound encasing the plurality of semiconductor die, the mold compound having a first major surface, and a planar leading edge encompassing the plurality of semiconductor die and extending a length of the entire stack, the leading edge formed at a non-perpendicular angle to the major surface and the plurality of conductive bumps exposed at the leading edge.

10. The semiconductor device of claim 9, wherein the mold compound includes holes formed in the mold compound, the holes exposing the plurality of conductive bumps.

11. The semiconductor device of claim 10, wherein the plurality of holes are formed in the mold compound after the mold compound is formed.

12. The semiconductor device of claim 9, wherein the semiconductor device is configured to be mounted to a signal carrier medium at an angle greater than 0° and less than 90°, said angle defined by the angle formed by the leading edge to the first major surface of the mold compound.

13. A semiconductor assembly, comprising:
a signal carrier medium; and
a semiconductor device, comprising:
a plurality of semiconductor die mounted together in a stepped, offset stack, the plurality of semiconductor die each including a plurality of electrical contacts, and
a mold compound encasing the plurality of semiconductor die, the mold compound having a first major surface, and a leading edge, the leading edge formed at a non-perpendicular angle to the major surface and the plurality of electrical contacts exposed at the leading edge,
wherein the leading edge of the semiconductor device is mounted adjacent to the signal carrier medium to mount the semiconductor device to the signal carrier medium at an angle, said angle defined by the angle formed by the leading edge to the first major surface of the mold compound.

14. The semiconductor assembly of claim 13, wherein the signal carrier medium comprises a printed circuit board.

15. The semiconductor assembly of claim 13, wherein the signal carrier medium comprises a plurality of electrically conductive contacts extending above a surface of the signal carrier medium, the electrically conductive contacts mating with the electric contacts of the plurality of semiconductor die.

16. The semiconductor assembly of claim 15, wherein the electrically conductive contacts comprise solder balls.

17. The semiconductor assembly of claim 15, wherein the electrical contacts comprise die bond pads defined in or on surfaces of the plurality of semiconductor die.

18. The semiconductor assembly of claim 15, wherein the electrical contacts comprise conductive bumps formed on die bond pads defined in or on surfaces of the plurality of semiconductor die.

19. The semiconductor assembly of claim 15, wherein the electrically conductive contacts are received within holes formed in mold compound.

20. The semiconductor assembly of claim 15, wherein the semiconductor die comprise non-volatile memory die.

21. The semiconductor assembly of claim 13, wherein the semiconductor device is mounted at an angle of between 30° and 60° to the signal carrier medium.

22. The semiconductor assembly of claim 13, wherein the semiconductor device is mounted at an angle of 45° to the signal carrier medium.

* * * * *